United States Patent
Dakshinamoorthy et al.

(10) Patent No.: US 12,261,623 B2
(45) Date of Patent: Mar. 25, 2025

(54) DECODING METADATA ENCODED IN ERROR CORRECTION CODES

(71) Applicant: Microsoft Technology Licensing, LLC, Redmond, WA (US)

(72) Inventors: Srikanth Dakshinamoorthy, Portland, OR (US); Majid Anaraki Nemati, San Diego, CA (US); Perry Willmann Remaklus, Jr., Raleigh, NC (US); Ravinder Kumar, Morrisville, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/316,913

(22) Filed: May 12, 2023

(65) Prior Publication Data
US 2024/0380415 A1    Nov. 14, 2024

(51) Int. Cl.
*H03M 13/11* (2006.01)
*H03M 13/15* (2006.01)

(52) U.S. Cl.
CPC .... *H03M 13/1108* (2013.01); *H03M 13/1134* (2013.01); *H03M 13/1515* (2013.01)

(58) Field of Classification Search
CPC ......... H03M 13/1108; H03M 13/1134; H03M 13/1515
See application file for complete search history.

(56) References Cited

U.S. PATENT DOCUMENTS

| | | | |
|---|---|---|---|
| 7,772,998 B2* | 8/2010 | Cho | H04N 21/2353 341/51 |
| 8,040,262 B2* | 10/2011 | Cho | H04N 21/2662 341/51 |
| 8,429,498 B1 | 4/2013 | Anholt et al. | |
| 11,722,152 B1* | 8/2023 | Musoll | G11C 29/36 714/764 |
| 2007/0268834 A1 | 11/2007 | Buckley | |
| 2008/0148129 A1 | 6/2008 | Moon et al. | |
| 2009/0045987 A1 | 2/2009 | Cho et al. | |

(Continued)

FOREIGN PATENT DOCUMENTS

| | | |
|---|---|---|
| CN | 101822050 A | 9/2010 |
| JP | 2006304351 A | 11/2006 |

OTHER PUBLICATIONS

International Search Report and Written Opinion received for PCT Application No. PCT/US2024/025904, Jul. 26, 2024, 17 pages.

*Primary Examiner* — Cynthia Britt
(74) *Attorney, Agent, or Firm* — Holzer Patel Drennan

(57) ABSTRACT

Embodiments of the present disclosure include techniques for encoding and decoding metadata in error correction codes. During read operation, a decoder generates a first output corresponding to the at least one metadata bit having a first state and a second output corresponding to the at least one metadata bit having a second state. When one of the first and second outputs have a zero value, the decoder sets a value of the at least one metadata bit to the first state or the second state corresponding to the first output or the second output having the zero value. When both the first and second outputs are non-zero, the decoder decodes the codeword with the assumption of both the metadata bit having the first state and the second state to determine if the codeword is correctable with the at least one metadata bit.

20 Claims, 7 Drawing Sheets

(56) References Cited

U.S. PATENT DOCUMENTS

| | | |
|---|---|---|
| 2012/0278687 A1 | 11/2012 | Sharon et al. |
| 2013/0283115 A1 | 10/2013 | Sazeides |
| 2016/0026526 A1* | 1/2016 | Zhang ................ G06F 11/1048 |
| | | 714/764 |
| 2017/0017545 A1 | 1/2017 | Tanabe |

* cited by examiner

| Time | SYND CHECK | KES1 | KES2 | CHIEN1 | CHIEN2 | Output to DP |
|---|---|---|---|---|---|---|
| 0 | Into SynCheck | | | | | |
| 1 | CW0 | | | | | |
| 2 | CW1 | CW0 | | | | |
| 3 | CW2 | CW1 | CW0 | | | |
| 4 | CW3 | CW2 | CW1 | CW0 | | |
| 5 | 2CW0 | CW3 | CW2 | CW1 | CW0 | |
| 6 | 2CW1 | 2CW0 | CW3 | CW2 | CW1 | CW0 |
| 7 | 2CW2 | 2CW1 | 2CW0 | CW3 | CW2 | CW1 |
| 8 | 2CW3 | 2CW2 | 2CW1 | 2CW0 | CW3 | CW2 |
| 9 | 3CW0 | 2CW3 | 2CW2 | 2CW1 | 2CW0 | CW3 |
| 10 | 3CW1 | 3CW0 | 2CW3 | 2CW2 | 2CW1 | 2CW0 |
| 11 | 3CW2 | 3CW1 | 3CW0 | 2CW3 | 2CW2 | 2CW1 |
| 12 | 3CW3 | 3CW2 | 3CW1 | 3CW0 | 2CW3 | 2CW2 |
| 13 | | 3CW3 | 3CW2 | 3CW1 | 3CW0 | 2CW3 |
| 14 | | | 3CW3 | 3CW2 | 3CW1 | 3CW0 |
| 15 | | | | 3CW3 | 3CW2 | 3CW1 |
| 16 | | | | | 3CW3 | 3CW2 |
| 17 | | | | | | 3CW3 |
| 18 | | | | | | |

DECODING METADATA ENCODED IN ERROR CORRECTION CODES

BACKGROUND

The present disclosure relates generally to error correction encoding and decoding, and in particular, to decoding metadata encoded in error correction codes.

When digital data in the form of 0s and 1s (bits) is passed between devices on a computer, it is often the practice to use error correction codes to ensure data integrity. For example, error correction codes may analyze sections of data and generate codes from the data values. After data is passed between devices, the codes may be checked to determine if any of the bits have changed. However, error correction codes consume bits themselves, and hence memory space and bandwidth.

DETAILED DESCRIPTION

Figure 1:
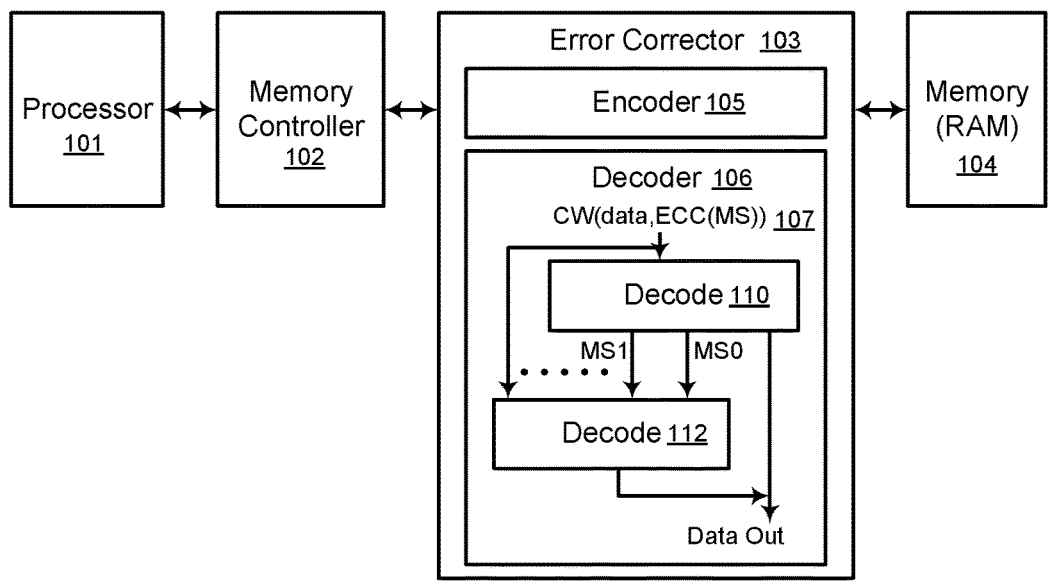
FIG. 1 illustrates a system for decoding metadata encoded in error correction codes according to an embodiment.

Described herein are techniques for decoding metadata encoded in error correction codes. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

Features and advantages of the present disclosure include encoding and decoding metadata bits in error correction codes (ECCs). ECC is typically implemented by taking a cache line and building it into multiple codewords (CW) that are formed by a collection of specified number of bits, sometimes called symbols. Reed-Solomon (RS) coding is one example error correction code. Error correction coding is the entire process of using code words to store data and parity together such that, upon reading back, the correctness of the original data can be determined. Error correction code parity are the bits generated, which are referred to herein as error correction codes ("ECC"). In a given RS ECC architecture, the symbol width is defined. The symbols of a codeword are encoded to generate the ECC/parity bits. These parity bits are composed into ECC symbols and written on to the media along with the data symbols. Embodiments of the present disclosure encode additional metadata along with the data bits (e.g., while generating the ECC). In such cases, the metadata information may be encoded inside the parity symbols, for example, instead of directly stealing some bits from parity. The metadata may comprise one or more bits, for example. In one embodiment, the metadata is a single poison bit indicating the associated data contains an error, for example. Encoding additional metadata onto the ECC symbols allows storage of additional information in the media, without losing media read/write bandwidth since the metadata is encoded and may not be separately physically stored onto the media. However, such encoding may affect the correction capability of the RS code and such an effect may be minimized. To achieve this goal, some embodiments may use the dependencies of codewords in a cache line, e.g., the same metadata for all codewords. Upon reading back from the media, additional decoding is necessary to determine the correct value of the encoded metadata. When the overall error detection and correction probability is acceptable, this method of encoding the metadata symbol (MS) along with the ECC may provide the additional capability of storing the metadata onto the media, without compromising the media read/write bandwidth.

The present disclosure includes an example architecture and implementation of the cache line decode algorithm (e.g., a modified concurrent double decoding algorithm), where a single bit, for example, of metadata encoded along with the data can be deterministically known with an optimal number of decodes. By invoking parallel decoders whenever necessary and suppressing unnecessary decodes when not necessary, some embodiments achieve minimal latency as well as lower power while the full decode pipeline needs to be activated.

FIG. 1 illustrates a system for decoding metadata encoded in error correction codes according to an embodiment. In this example, a processor 101 may be coupled to a memory 104 through a memory controller 102 and error corrector 103. Processor 101 may be any of a variety of processors, such as an x86 or ARM based microprocessor, artificial intelligence processor, graphics processor, or other processor that manipulates digital data and sends and receives the data with other devices, for example. Memory controller 102 manages the interface between processor 101 and memory 104. Memory 104 stores digital information, and may be a random access memory (e.g., DRAM or Dual Inline Memory Module). In some embodiments, processor 101, memory controller 102, and error corrector 103 are on the same semiconductor integrated circuit, which communicates with one or more DIMMs.

Data being written to memory may have one or more metadata bits encoded in error correction codes. Data may be manipulated in 512 bit words, which may be subdivided in to 128 bit "beats," for example. Error corrector 103 may include an encoder 105 for generating the parities of error correction codes (ECCs) for the data as the data is written to memory 104. The parities are associated with the data used to generate them. As described herein, one or more metadata bits are encoded in the ECCs for future use. The combination of data and associated ECC parities (and metadata) are sometimes referred to as a codeword. Codewords are stored in memory 104.

During a read operation, codewords are retrieved from memory 104. Error corrector 103 includes an encoder for encoding ECCs associated with data and a decoder 106 for decoding the ECCs and metadata. Error corrector 103 may include a Reed-Solomon encoder and decoder, for example. Decoder 106 receives a codeword (CW) 107 comprising data and an associated ECC. The ECC comprises encoded bits including at least one metadata bit. Decoder 110 may include a first decode stage 110 to generate a plurality of outputs (for example syndrome values). One output may correspond to the data matching the ECC codes (valid data with no errors to be corrected). However, other outputs may be used to determine the value of the metadata. For instance, one output (labeled MS0, metadata symbol equal to 0) may correspond to a metadata bit having a first state (e.g., 0) and a second output (labeled MS1, metadata symbol equal to 1) may correspond to the metadata bit having a second state (e.g., 1). For example, MS0 may correspond to decoding the ECC assuming the metadata bit has a '0' value (a first state), and MS1 may correspond to decoding the ECC assuming the metadata bit has a '1' value (a second state). If multiple metadata bits are encoded in the ECC, additional outputs may be used to determine the additional metadata values (e.g., 00, 01, 10, 11 for two metadata bits). MS0 and MS1 are coupled to a second decode stage 112.

The MS0 and MS1 outputs and the CW are processed as follows. The outputs of the first decode stage 110 may each be a plurality of bits indicating if the ECC detected any errors in the associated data. If all the bits of the output are 0, then the output is free of errors. However, in this example, if the output is non-zero, then an error exists in the data. Accordingly, when one of the first output or second output have a zero value, decoder 106 may set a value of the metadata bit to the first state or the second state corresponding to the first output or the second output having the zero value. For example, the metadata bit may be set to '0' if the first output MS0 has a zero value (i.e., assuming the metadata bit was '0' was correct and produced no errors), and the metadata bit may be set to '1' if MS1 has a zero value (i.e., assuming the metadata bit was '1' was correct and produced no errors). On the other hand, when both the first output MS0 and the second output MS1 are non-zero (i.e., indicating that data has some errors under both metadata assumptions and need to be fully decoded to determine if it can be corrected), the codeword is decoded under both assumptions to determine a value of the at least one metadata bit.

In some embodiments, first decode stage 110 is a syndrome checker, which produces multibit symbols for the outputs (e.g., MS0, MS1, etc.). Accordingly, in some embodiments, the MS0 and MS1 may be generated by decoding the data and associated error correction code using a syndrome check hardware decoder component, for example. The multibit symbols are then used to direct the flow of data and ECC into a second decoder stage 112. When both MS0 and MS1 are non-zero, decode stage 112 may decode CW to obtain the metadata. In some embodiments described in more detail below, parallel decoder hardware may be used to reduce latency, for example.

Figure 3:
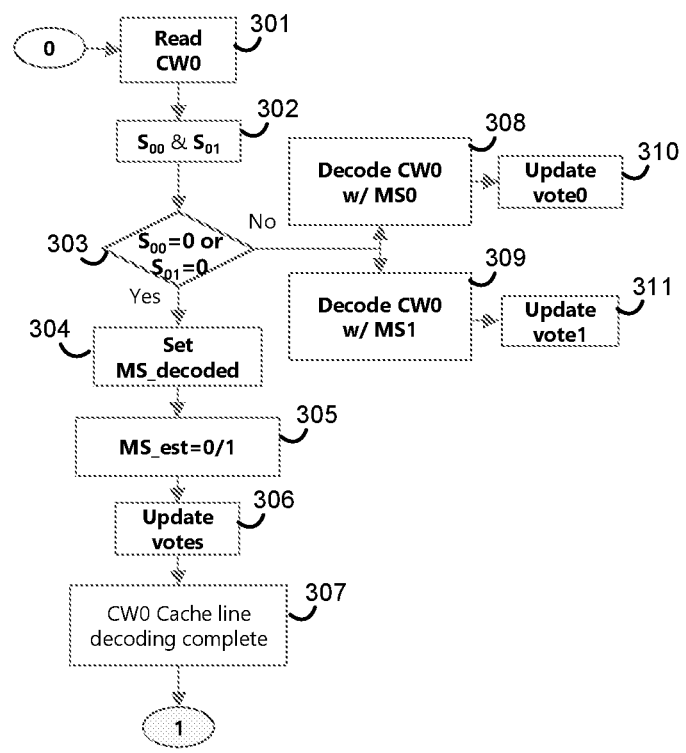
FIG. 3 illustrates an example process for decoding a first codeword according to an embodiment.

During a read operation, decoder 106 successively receives a plurality of codewords comprising data and associated ECCs, which include at least one metadata bit. For example, a block of memory (e.g., a cacheline) may comprise 512 bits divided into four (4) 128 bit "beats." Each beat of 128 bits of data may have an associated ECC, and each of the four (4) ECCs associated with each beat of the cacheline may be encoded with the same metadata bit(s). As described in more detail below, this allows recovery of the metadata bit(s). For instance, in one embodiment, when one of the outputs (e.g., MS0, MS1) has a zero value for a first codeword, the decoder may set a flag indicating the at least one metadata bit value has been set for the first error correction code. Accordingly, when both the first output and the second output are non-zero for subsequent codewords (as illustrated in FIG. 3 at 303 below), the decoder may decode assuming the metadata value is the same as the previous result. If the results don't match, the data may have an uncorrectable error. When the previous codeword was not determined without further decoding, the subsequent codewords are further decoded as described above and further below. Finally, upon determining the value of at least one metadata bit for each codeword, the system may cast a vote specifying the determined value of the at least one metadata bit. The codewords are decoded when each vote matches (e.g., each codeword produced the same value for the metadata). However, if any one of the codewords produced a different metadata value, then the data may have an uncorrectable error.

Figure 2:
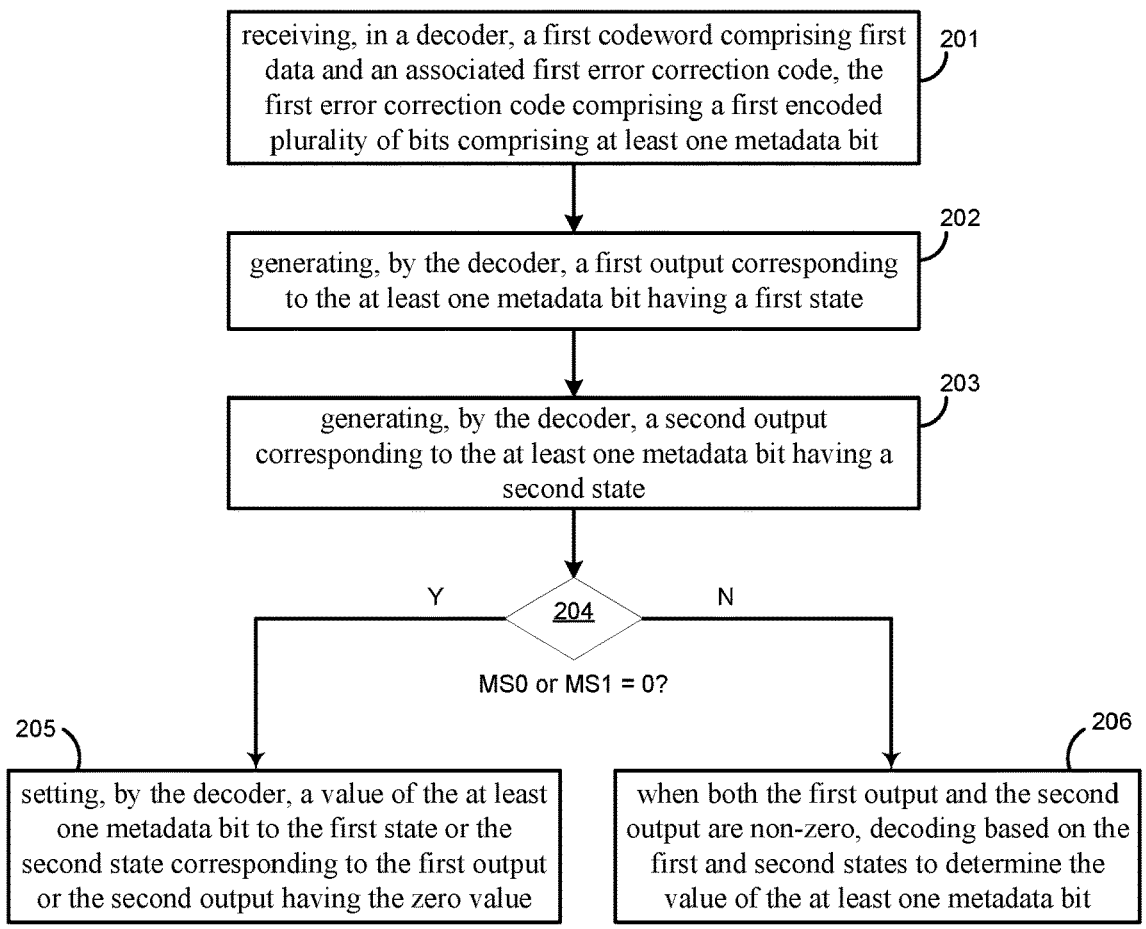
FIG. 2 illustrates a method of decoding metadata encoded in error correction codes according to an embodiment.

FIG. 2 illustrates a method of decoding metadata encoded in error correction codes according to an embodiment. At 201, a first codeword is received in a decoder, the first codeword comprising first data and an associated first error correction code. The first error correction code comprises a first encoded plurality of bits comprising at least one metadata bit. At 202, the decoder generates a first output corresponding to the at least one metadata bit having a first state. At 203, the decoder generates a second output corresponding to the at least one metadata bit having a second state. At 205, the system determines if either output is all zeros. When one of the first output and second output have a zero value, at 205, the decoder sets a value of the at least one metadata bit to the first state or the second state corresponding to the first output or the second output having the zero value. When both the first output and the second output are non-zero, at 206, the decoder decodes the first codeword corresponding to the at least one metadata bit having the first state and decodes the first codeword corresponding to the at least one metadata bit having the second state to determine a value of the at least one metadata bit.

FIG. 3 illustrates an example process for decoding a first codeword according to an embodiment. In the following examples shown in FIGS. 3-7, a 512 bit cacheline is divided into 4 128 bit beats with a single metadata bit encoded in the ECC for each beat. Four codewords (CW) are read from memory. Each codeword has an associated ECC, which includes ECC bits and an encoded metadata bit (referred to hereinafter as a metadata symbol, MS). At 301, CW0 is read. At 302, a syndrome check produces two outputs comprising symbols S00 and S01 corresponding to decoding the data and ECC for CW0 assuming the metadata symbol value (MS) is 0 (S00) and 1 (S01). Output symbols S00 and S01 are multibit values. If an output is all zeros, then there are no errors. Thus, if either output is 0, the corresponding assumption is correct, and the MS value is the assumed value.

At 303, the system determines if either S00 or S01 are all zeros. If yes, then a flag is set indicating that the metadata bit has been decoded (e.g., MS_decoded=True) at 304. Additionally, an estimate of the MS value is set to the appropriate value (e.g., MSest=0 or 1) at 305. At 306, a vote is cast for the value of the MS. At 307, CW0 decoding is complete. However, if neither S00 nor S01 are all zero, then CW0 is decoded assuming MS is 0 (MS0) and CW0 is decoded assuming MS is 1 (MS1) at 308 and 309, respectively. Each output casts a vote at 310 and 311 if the outputs of the second decode support the result.

Figure 4:
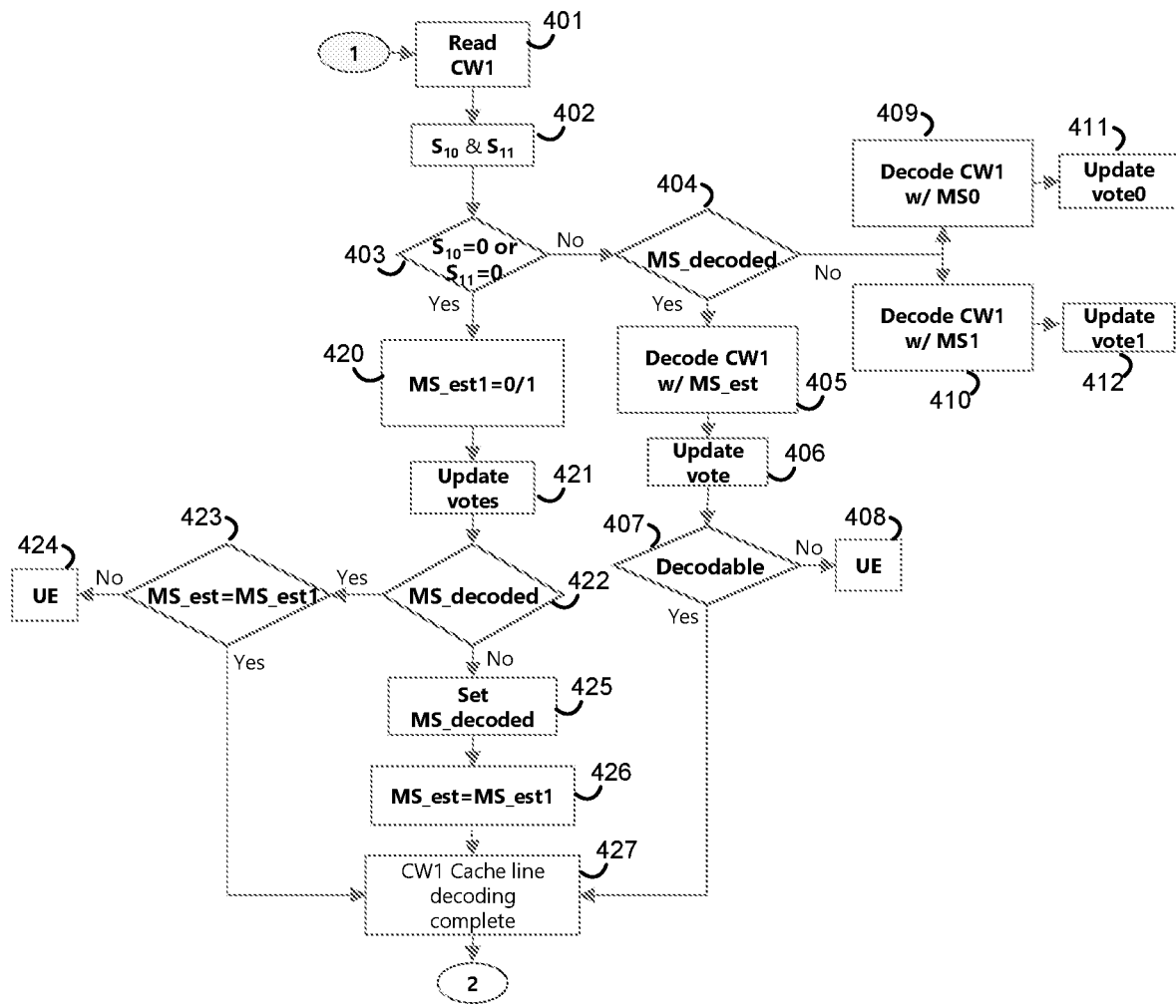
FIG. 4 illustrates an example process for decoding a second codeword according to an embodiment.

FIG. 4 illustrates an example process for decoding a second codeword according to an embodiment. FIG. 4 illustrates the processing of the second codeword (CW1) to be read. At 401, CW1 is read. At 402, a syndrome check produces two outputs comprising symbols S10 and S11 corresponding to decoding the data and ECC for CW1 assuming the metadata symbol value (MS) is 0 (S10) and 1 (S11). As above, output symbols S10 and S11 are multibit values. If an output is all zeros, then there are no errors. Thus, if either output is 0, the corresponding assumption is correct, and the MS value is the assumed value.

At 403, the system determines if either S10 or S11 are all zeros. If yes, then an estimate of the MS value is set to the appropriate value (e.g., MS_est1=0 or 1) at 420. At 421, a vote is cast for the value of the MS. At 422, the MS_decoded flag is checked. If yes, then the estimated values are compared at 423. If they match, then CW1 decoding is complete. However, if they do not match, an uncorrectable error flag is triggered. If MS_decoded is No, then MS_decoded is set at 425, MS_est is set equal to MS_est1 at 426, and CW1 decoding is completed at 427.

Referring again to 403, if neither S10 nor S11 are all zero, then MS_decoded is checked at 404. If yes, then CW1 may be decoded using the value of MS_est from CW0 at 405. The result is used to cast a vote at 406. If decodable at 407 (decode 405 produces all zeros based on the assumption of MS=MS_est), then CW1 decoding is complete. If not decodable at 407, then an uncorrectable error is recorded at 408. If MS_decoded is not set at 404, then CW1 is decoded assuming MS is 0 (MS0) and CW1 is decoded assuming MS is 1 (MS1) at 409 and 410, respectively. Each output casts a vote at 411 and 412 if the outputs of the second decode support the result.

Figure 5:
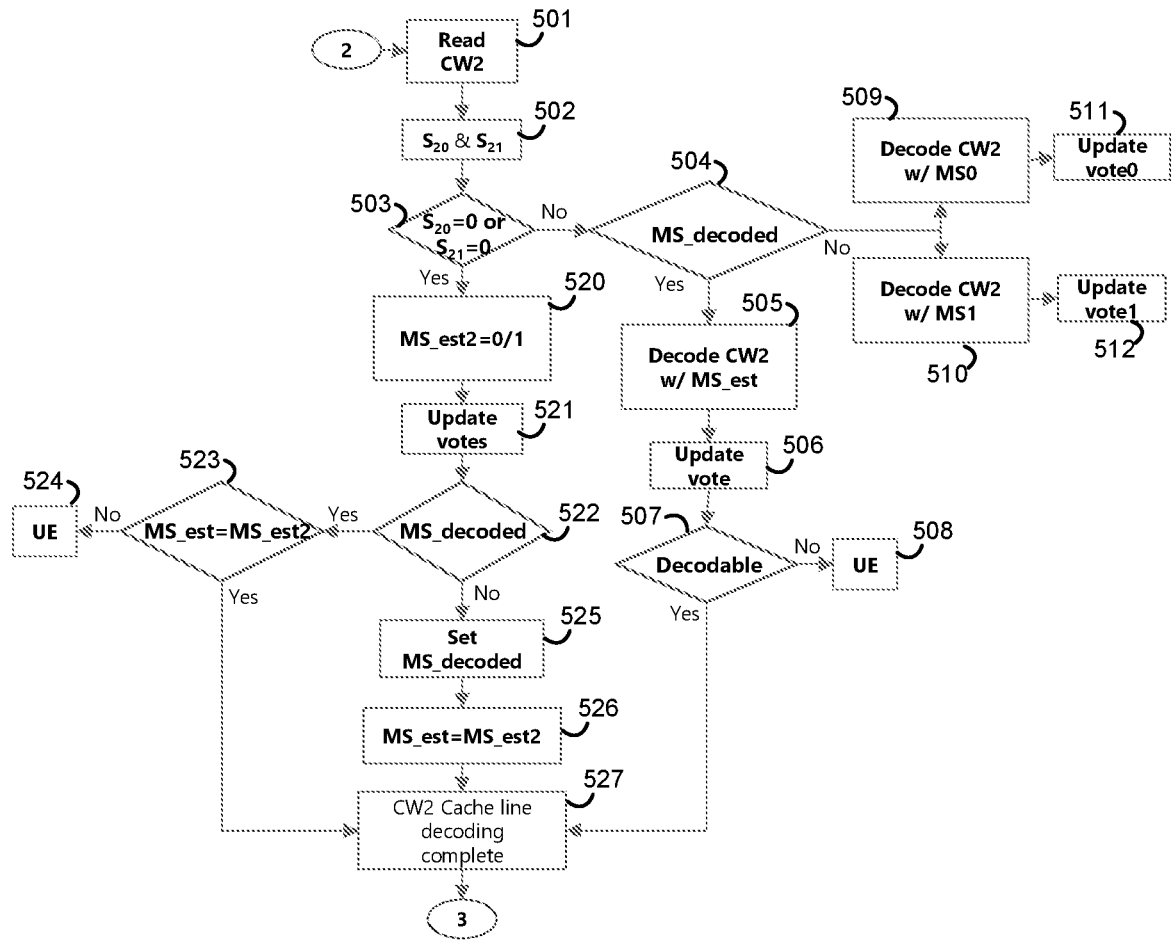
FIG. 5 illustrates an example process for decoding a third codeword according to an embodiment.
Figure 6:
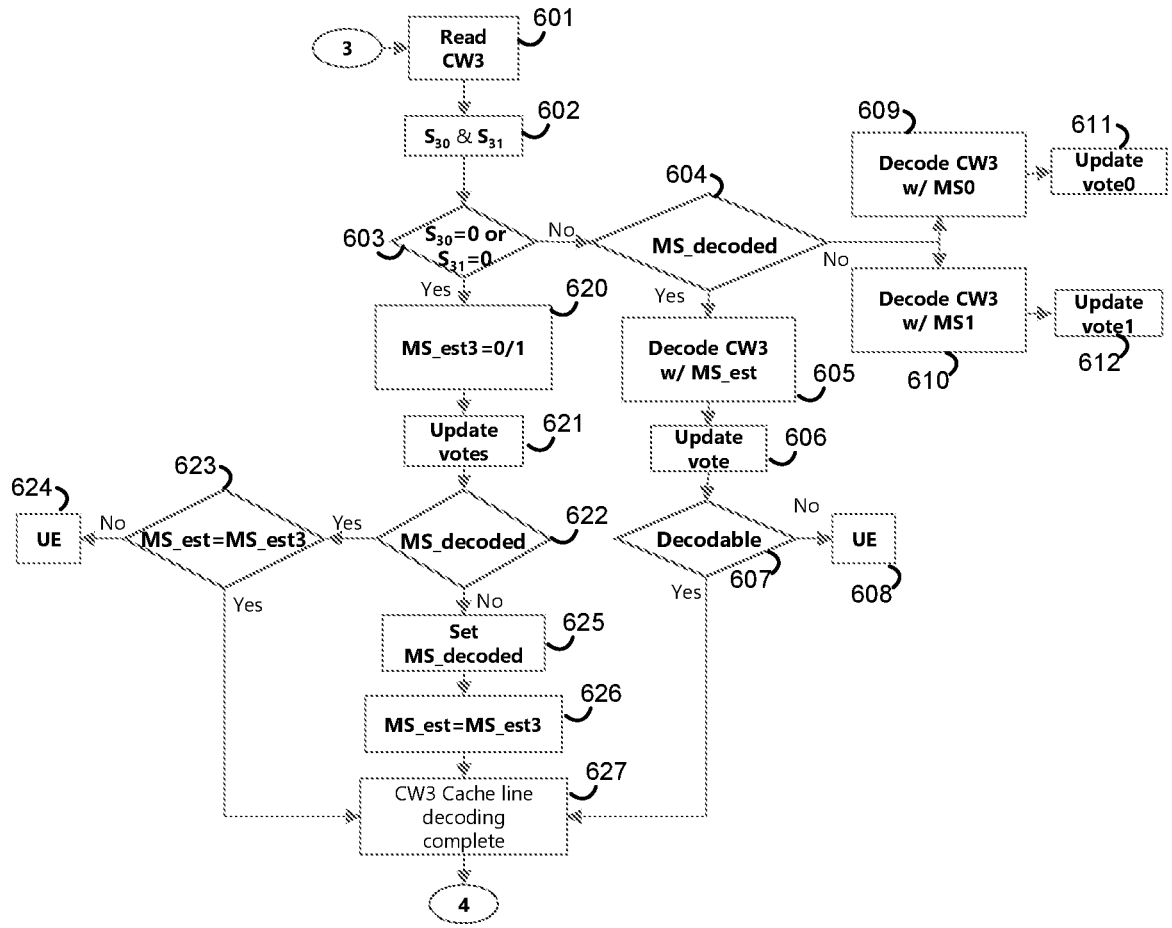
FIG. 6 illustrates an example process for decoding a fourth codeword according to an embodiment.

FIG. 5 illustrates an example process for decoding a third codeword according to an embodiment. The third codeword (CW2) is processed using a substantially similar process as illustrated in FIG. 4 for CW1. The process is illustrated in steps 501-527, where S20 and S21 are the output symbols and MS_est2 is the value for MS when either S20 or S21 is all zeros, for example. FIG. 6 illustrates an example process for decoding a fourth codeword according to an embodiment. The fourth codeword (CW3) is processed using a substantially similar process as illustrated in FIGS. 4 and 5 for CW1 and CW2. The process is illustrated in steps 601-627, where S30 and S31 are the output symbols and MS_est3 is the value for MS when either S30 or S31 is all zeros, for example.

Figure 7:
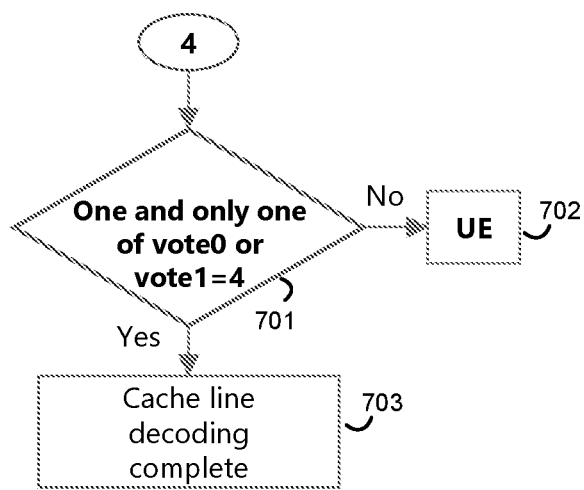
FIG. 7 illustrates an example of voting according to an embodiment.

FIG. 7 illustrates an example of voting according to an embodiment. As described above, embodiments of the disclosure may include a decoder that casts votes for a metadata value stored in multiple ECCs across multiple codewords. Referring to FIGS. 4-6 above, at 701 the system determines if one and only one vote is cast for either MS=0 or MS=1 (e.g., each vote for each CW matches). If not, the system triggers an uncorrectable error. If yes, then the cacheline decoding is completed.

Figures 8, 9:
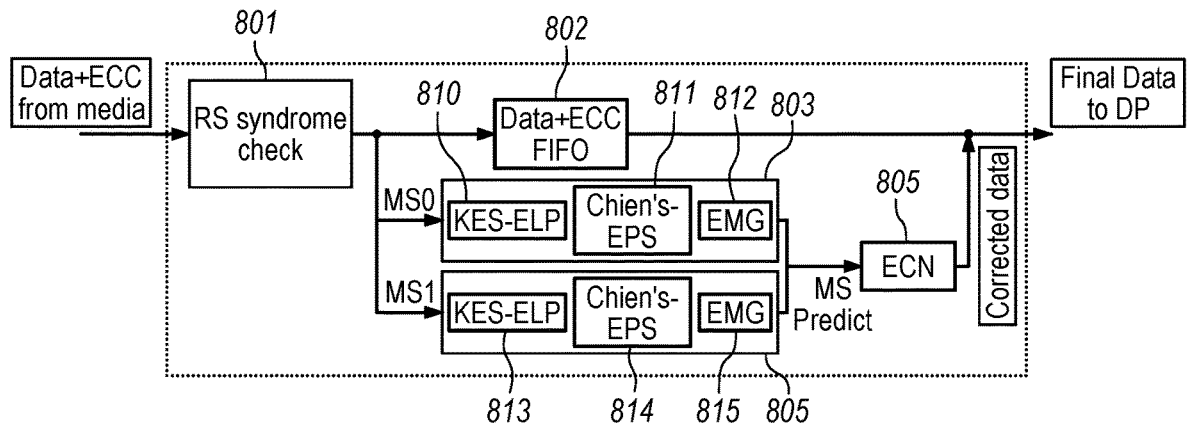
FIG. 8 illustrates an example hardware architecture for decoding metadata encoded in error correction codes according to an embodiment.
FIG. 9 illustrates an example timing diagram for decoding metadata encoded in error correction codes according to an embodiment.

FIG. 8 illustrates an example hardware architecture for decoding metadata encoded in error correction codes and FIG. 9 illustrates an example timing diagram for decoding metadata encoded in error correction codes. Referring to FIG. 8, data and ECC are received from media (e.g., RAM) in a RS syndrome check hardware decoder component 801. If either output symbol (assuming MS-0 or 1) is all zeros, the data and ECC are stored in first in first out (FIFO) 802. According to the algorithms shown above, each CW may be further decoded assuming MS=((path MS0) or MS=1 (path MS1). The decoder in this example may include first and second hardware decoder components 803 and 805 for decoding the CW based on the first output and the second output in parallel. Each decoder 803/805 may be substantially the same and include a key equation solver error location polynomial (KES-ELP) section 810/813, a Chien's Error Position Search (EPS) section 811/814, an Error Magnitude calculation (EMG) section 812/815, and an Error Correction (ECN) section 805, for example. The timing diagram in FIG. 9 illustrates how codewords flow through the system. A time 1 the syndrome check is performed CW0, and each subsequent CW on each subsequent cycle. CW0 is processed by KES1 and KES2 (two cycles of each KES stage) on cycle 2 and 3, and CW0 is processed by CHIEN1 and CHIEN2 (two cycles for each CHIEN stage) on cycles 4 and 5. Finally, CW0 is processed by EMG and ECN on cycle 6 and provided to the output data path (DP), for example. Subsequent CWs are processed in a pipeline manner as illustrated in FIG. 9.

In various example embodiments, the underlying Reed-Solomon decoder may be a fully pipelined multi-stage <n cycles> decoder. In the first clock cycle, the validity of the syndrome (under both metadata assumptions when there is only one bit of meta data) is determined, upon which the decision of whether the full decoder needs to be invoked is made. If the CW syndrome is valid with either of the metadata assumptions (MS0 or MS1), it will not be valid with the other and doesn't need to go through the remaining (n−1) stages of the full decoder.

If the syndrome is not valid under either MS assumption, it means the CW has errors and may go through the full decoder to determine if it can be corrected or not. To minimize the latency, the CW in this case is decoded with both MS options in parallel by invoking two full Reed-Solomon decoder instances, for example. However, once the MS value has been established for a given CW, subsequent beats of the same cache line do not need to be decoded with both MS options as illustrated in the algorithms shown in FIGS. 4-6. Suppressing the activation of the full decoder in these scenarios advantageously saves power. As soon as an error free CW appears and the MS value is known for that particular codeword, and subsequently for the cache line, embodiments of the disclosure leverage this information to minimize the number of decodes for the subsequent CWs in the same cache line.

If all the CWs in the cache line have errors, the system may perform 8 full decodes for 4 codewords in the cache line. For any other combination of clean and erroneous CWs, using the method described above, the required number of decodes will be minimized, with the best case being the first CW being clean. In that case, the subsequent CWs need only be decoded with the known good MS assumption, reducing the number of required full decodes to just three as illustrated above.

Physically storing metadata bit(s) onto the media is an advantageous solution, but may reduce media bandwidth and storage capacity. However, in some embodiments, multiple codewords may be used to carry one bit of metadata. This means the correlation between the codewords can be used for decoding, and thus prevent a majority of error patterns. Another advantage of some embodiments is the granularity of the number of metadata bits it can handle. Various embodiments may use just as many number of bits as needed for metadata and maintain the ECC correction capability at its optimal level without stealing ECC bits, for example.

Further Examples

Each of the following non-limiting features in the following examples may stand on its own or may be combined in various permutations or combinations with one or more of the other features in the examples below. In various embodiments, the present disclosure may be implemented as a processor or method.

Embodiments of the disclosure include a system, computer readable medium, and/or method for decoding. In one embodiment, the present disclosure includes a system comprising: a processor; a memory controller; and a decoder, wherein the decoder receives a first codeword comprising first data and an associated first error correction code, the first error correction code comprising a first encoded plurality of bits comprising at least one metadata bit, and the decoder generates a first output corresponding to the at least one metadata bit having a first state and a second output corresponding to the at least one metadata bit having a second state, wherein when one of the first output or second output have a zero value, setting, by the decoder, a value of the at least one metadata bit to the first state or the second state corresponding to the first output or the second output having the zero value, and when both the first output and the second output are non-zero, decoding the first codeword corresponding to the at least one metadata bit having the first state and decoding the first codeword corresponding to the at least one metadata bit having the second state to determine a value of the at least one metadata bit.

In one embodiment, the decoder is a Reed-Solomon decoder.

In one embodiment, the first output corresponds to decoding the first error correction code assuming the at least one metadata bit has the first state and the second output corresponds to decoding the first error correction code assuming the at least one metadata bit has the second state.

In one embodiment, the decoder successively receives a plurality of second codewords comprising second data and an associated plurality of second error correction codes, the second error correction codes comprising a second encoded plurality of bits comprising the at least one metadata bit.

In one embodiment, when one of the first output or second output have the zero value for the first codeword, setting, by the decoder, a flag indicating the codeword is correctable with the at least one metadata bit value that has been set for the first error correction code, and wherein when both the first output and the second output are non-zero for the plurality of second codewords, decoding, for the plurality of second codewords, based on the first output and the second output to determine the value of the at least one metadata bit when the flag is in a first state, and decoding, for the plurality of second codewords, based on one of the first output or the second output, based on the flag, to determine the value of the at least one metadata bit when the flag is in a second state.

In one embodiment, upon determining the value of the at least one metadata bit for each codeword, casting a vote specifying the determined value of the at least one metadata bit, and wherein the first codeword and the plurality of second codewords are decoded when each vote matches.

In one embodiment, the first output and the second output are generated by decoding the first data and the first error correction code using a syndrome check hardware decoder component.

In one embodiment, the decoder comprises a first hardware decoder component and a second hardware decoder component, for decoding based on the first output and the second output in parallel.

In one embodiment, the at least one metadata bit is a single bit.

In one embodiment, the single bit is a poison bit indicating the associated data contains an error.

In one embodiment, the decoder receives the first data and the first error correction code parity from a random access memory.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A system comprising:
a processor;
a memory controller; and
a decoder, wherein the decoder receives a first codeword comprising first data and an associated first error correction code, the first error correction code comprising a first encoded plurality of bits comprising at least one metadata bit, and the decoder generates a first output corresponding to the at least one metadata bit having a first state and a second output corresponding to the at least one metadata bit having a second state,
wherein in response to determining that one of the first output or second output have a zero value, setting, by the decoder, a value of the at least one metadata bit to the first state or the second state corresponding to the first output or the second output having the zero value, and
in response to determining that both the first output and the second output are non-zero, decoding the first codeword corresponding to the at least one metadata bit having the first state and decoding the first codeword corresponding to the at least one metadata bit having the second state to determine a value of the at least one metadata bit.

2. The system of claim 1, wherein the decoder is a Reed-Solomon decoder.

3. The system of claim 1, wherein the first output corresponds to decoding the first error correction code assuming the at least one metadata bit has the first state and the second output corresponds to decoding the first error correction code assuming the at least one metadata bit has the second state.

4. The system of claim 1, wherein the decoder successively receives a plurality of second codewords comprising second data and an associated plurality of second error correction codes, the second error correction codes comprising a second encoded plurality of bits comprising the at least one metadata bit.

5. The system of claim 4, wherein in response to determining that one of the first output or second output have the zero value for the first codeword, setting, by the decoder, a flag indicating the codeword is correctable with the at least one metadata bit value that has been set for the first error correction code, and
wherein in response to determining that both the first output and the second output are non-zero for the plurality of second codewords,
decoding, for the plurality of second codewords, based on the first output and the second output to determine the value of the at least one metadata bit while the flag is in a first state, and decoding, for the plurality of second codewords, based on one of the first output or the second output, based on the flag, to determine the value of the at least one metadata bit while the flag is in a second state.

6. The system of claim 5, wherein, upon determining the value of the at least one metadata bit for each codeword, casting a vote specifying the determined value of the at least one metadata bit, and wherein the first codeword and the plurality of second codewords are decoded in response to determining that each vote matches.

7. The system of claim 1, wherein the first output and the second output are generated by decoding the first data and the first error correction code using a syndrome check hardware decoder component.

8. The system of claim 1, wherein the decoder comprises a first hardware decoder component and a second hardware decoder component, for decoding based on the first output and the second output in parallel.

9. The system of claim 8, wherein the at least one metadata bit is a single bit.

10. The system of claim 9, wherein the single bit is a poison bit indicating the associated data contains an error.

11. The system of claim 1, wherein the decoder receives the first data and the first error correction code parity from a random access memory.

12. A decoding method comprising:
receiving, in a decoder, a first codeword comprising first data and an associated first error correction code, the first error correction code comprising a first encoded plurality of bits comprising at least one metadata bit;
generating, by the decoder, a first output corresponding to the at least one metadata bit having a first state;
generating, by the decoder, a second output corresponding to the at least one metadata bit having a second state; and
in response to determining that one of the first output and second output have a zero value, setting, by the decoder, a value of the at least one metadata bit to the first state or the second state corresponding to the first output or the second output having the zero value, and
in response to determining that both the first output and the second output are non-zero, decoding the first codeword corresponding to the at least one metadata bit having the first state and decoding the first codeword corresponding to the at least one metadata bit having the second state to determine a value of the at least one metadata bit.

13. The method of claim 12, wherein the decoder is a Reed-Solomon decoder.

14. The method of claim 12, wherein the first output corresponds to decoding the first error correction code assuming the at least one metadata bit has the first state and the second output corresponds to decoding the first error correction code assuming the at least one metadata bit has the second state.

15. The method of claim 12, wherein the decoder successively receives a plurality of second codewords comprising second data and an associated plurality of second error correction codes, the second error correction codes comprising a second encoded plurality of bits comprising the at least one metadata bit.

16. The method of claim 15, wherein in response to determining that one of the first output or second output have the zero value for the first codeword, setting, by the decoder, a flag indicating the at least one metadata bit value has been set for the first error correction code, and
wherein in response to determining that both the first output and the second output are non-zero for the plurality of second codewords,
decoding, for the plurality of second codewords, the first output and the second output to determine the value of the at least one metadata bit while the flag is in a first state and decoding, for the plurality of second codewords, one of the first output or the second output, based on the flag, to determine the value of the at least one metadata bit while the flag is in a second state.

17. The method of claim 16, wherein, upon determining the value of the at least one metadata bit for each codeword, casting a vote specifying the determined value of the at least one metadata bit, and wherein the first codeword and the plurality of second codewords are decoded in response to determining that each vote matches.

18. The method of claim 12, wherein the first output and the second output are generated by decoding the first data and the first error correction code using a syndrome check hardware decoder component.

19. The method of claim 12, wherein the decoder comprises a first hardware decoder component and a second hardware decoder component, for decoding based on the first output and the second output in parallel.

20. The method of claim 19, wherein the at least one metadata bit is a single bit.

* * * * *